(12) United States Patent
Wu et al.

(10) Patent No.: US 10,869,385 B2
(45) Date of Patent: Dec. 15, 2020

(54) SEMICONDUCTOR DEVICE, CIRCUIT BOARD STRUCTURE AND METHOD OF FABRICATING THE SAME

(71) Applicant: Taiwan Semiconductor Manufacturing Co., Ltd., Hsinchu (TW)

(72) Inventors: Jiun-Yi Wu, Taoyuan (TW); Chien-Hsun Lee, Hsinchu County (TW); Chen-Hua Yu, Hsinchu (TW); Chung-Shi Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/224,807

(22) Filed: Dec. 19, 2018

(65) Prior Publication Data
US 2020/0137871 A1 Apr. 30, 2020

Related U.S. Application Data

(60) Provisional application No. 62/752,361, filed on Oct. 30, 2018.

(51) Int. Cl.
| | |
|---|---|
| *H05K 1/02* | (2006.01) |
| *H05K 1/09* | (2006.01) |
| *H05K 1/18* | (2006.01) |
| *H05K 1/11* | (2006.01) |
| *H05K 3/46* | (2006.01) |
| *H05K 3/42* | (2006.01) |
| *H05K 3/02* | (2006.01) |

(52) U.S. Cl.
CPC ......... *H05K 1/0204* (2013.01); *H05K 1/0271* (2013.01); *H05K 1/09* (2013.01);
(Continued)

(58) Field of Classification Search
CPC .... H05K 1/11; H05K 1/14; H05K 1/141–144; H05K 1/18; H05K 1/181;
(Continued)

(56) References Cited

U.S. PATENT DOCUMENTS

| | | | |
|---|---|---|---|
| 6,759,600 B2 * | 7/2004 | Koyama | H05K 1/036 174/255 |
| 7,746,661 B2 * | 6/2010 | Liao | H05K 1/111 361/777 |

(Continued)

OTHER PUBLICATIONS

"Office Action of Taiwan Counterpart Application", dated Apr. 27, 2020, p. 1-p. 5.

*Primary Examiner* — Tuan T Dinh
(74) *Attorney, Agent, or Firm* — JCIPRNET

(57) ABSTRACT

A circuit board structure includes a first core layer, a first build-up layer and a second build-up layer. The first core layer has a first surface and a second surface opposite to the first surface, wherein the first core layer includes a core dielectric material layer and at least one patterned conductive plate embedded within the core dielectric material layer, the core dielectric material layer includes a first sub-dielectric material and a second sub-dielectric material, and at least one interface exists in between the first sub-dielectric material and the second sub-dielectric material. The first build-up layer is disposed on the first surface of the first core layer, and the second build-up layer is disposed on the second surface of the first core layer.

20 Claims, 15 Drawing Sheets

(52) U.S. Cl.
CPC ............. *H05K 1/115* (2013.01); *H05K 1/181* (2013.01); *H05K 3/022* (2013.01); *H05K 3/429* (2013.01); *H05K 3/4652* (2013.01); *H05K 2201/10734* (2013.01)

(58) Field of Classification Search
CPC .......... H05K 1/185; H05K 1/02; H05K 1/036; H05K 1/0306; H05K 3/02; H05K 3/42; H05K 3/46
USPC ......................... 361/764–766, 790–795, 803; 174/258–264; 257/685–730
See application file for complete search history.

(56) References Cited

U.S. PATENT DOCUMENTS

| | | | | |
|---|---|---|---|---|
| 8,242,379 B2* | 8/2012 | Ikeda | .................. | H01L 21/4857 174/261 |
| 10,433,426 B2* | 10/2019 | Liao | ....................... | H05K 3/465 |
| 2002/0131247 A1* | 9/2002 | Cooray | .................... | H01B 3/40 361/750 |
| 2003/0147227 A1* | 8/2003 | Egitto | ................ | H01L 21/4853 361/795 |
| 2006/0138591 A1 | 6/2006 | Amey et al. | | |
| 2012/0228006 A1* | 9/2012 | Chen | ..................... | H05K 1/0224 174/251 |
| 2013/0161073 A1* | 6/2013 | Lee | ....................... | H05K 3/4644 174/251 |
| 2014/0360765 A1* | 12/2014 | Kiwanami | ............. | H05K 1/185 174/260 |
| 2015/0061142 A1* | 3/2015 | Hsu | ........................ | H01L 25/50 257/773 |
| 2015/0101851 A1* | 4/2015 | Ko | ....................... | H05K 1/0306 174/258 |
| 2015/0102510 A1* | 4/2015 | Kaneda | ..................... | H05K 1/18 257/778 |
| 2016/0066423 A1* | 3/2016 | Sakamoto | ................ | H05K 1/02 174/261 |
| 2016/0330839 A1 | 11/2016 | Kuwako et al. | | |

\* cited by examiner

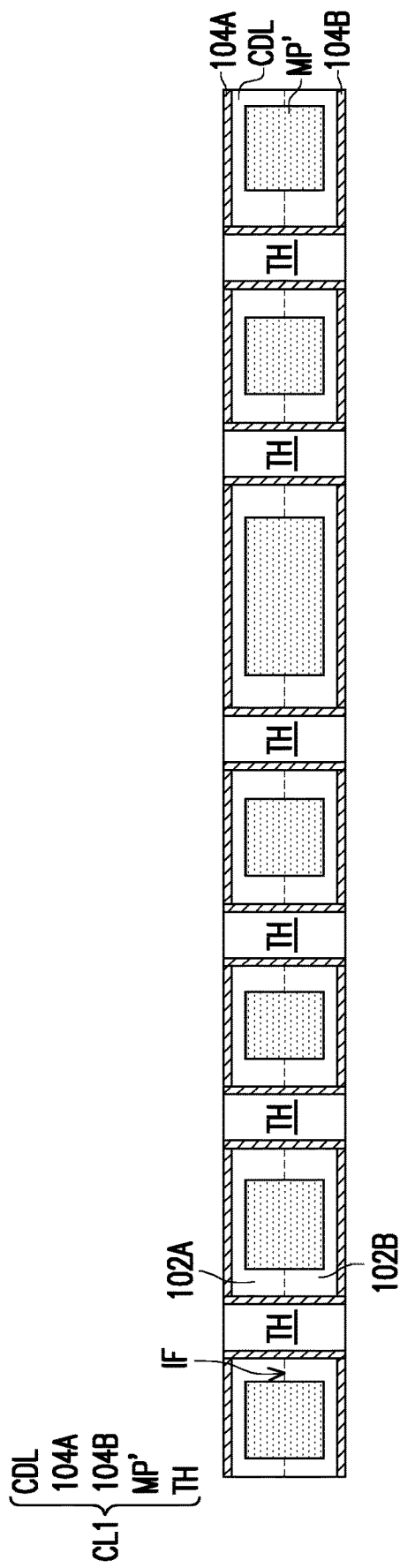
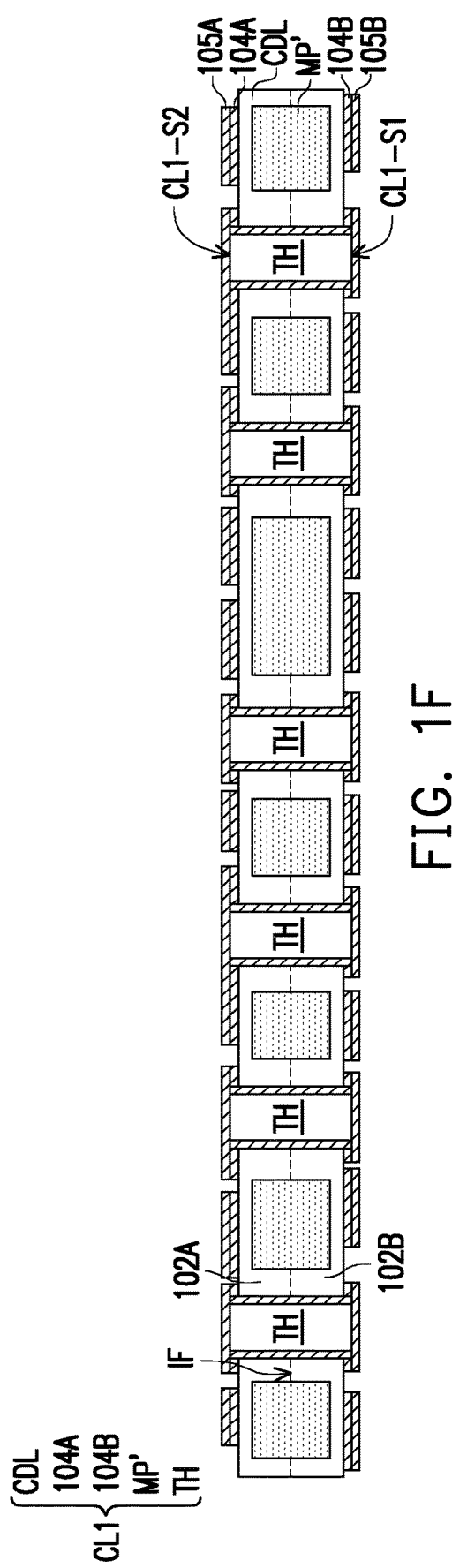
FIG. 1E
FIG. 1F

SEMICONDUCTOR DEVICE, CIRCUIT BOARD STRUCTURE AND METHOD OF FABRICATING THE SAME

CROSS-REFERENCE TO RELATED APPLICATION

This application claims the priority benefit of U.S. provisional application Ser. No. 62/752,361, filed on Oct. 30, 2018. The entirety of the above-mentioned patent application is hereby incorporated by reference herein and made a part of this specification.

BACKGROUND

Semiconductor devices are used in a variety of electronic applications, such as personal computers, cell phones, digital cameras, and other electronic equipment. In terms of the packaging used for integrated circuit components or semiconductor chips, one or more chip packages are generally bonded to a circuit carrier (e.g., a system board, a printed circuit board, or the like) for electrical connections to other external devices or electronic components.

Recently, high-performance computing (HPC) has become more popular and being widely used in advanced networking and server applications, especially for AI (artificial intelligence) related products that require high data rate, increasing bandwidth and for lowering latency. However, as the package size is getting larger for packages including the HPC component, warpage control and thermal dissipation of the circuit carrier has become a more challenging issue.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

FIG. 1A to FIG. 1I are schematic sectional views of various stages in a method of fabricating a semiconductor device according to some exemplary embodiments of the present disclosure.

DETAILED DESCRIPTION

Figure 1A:
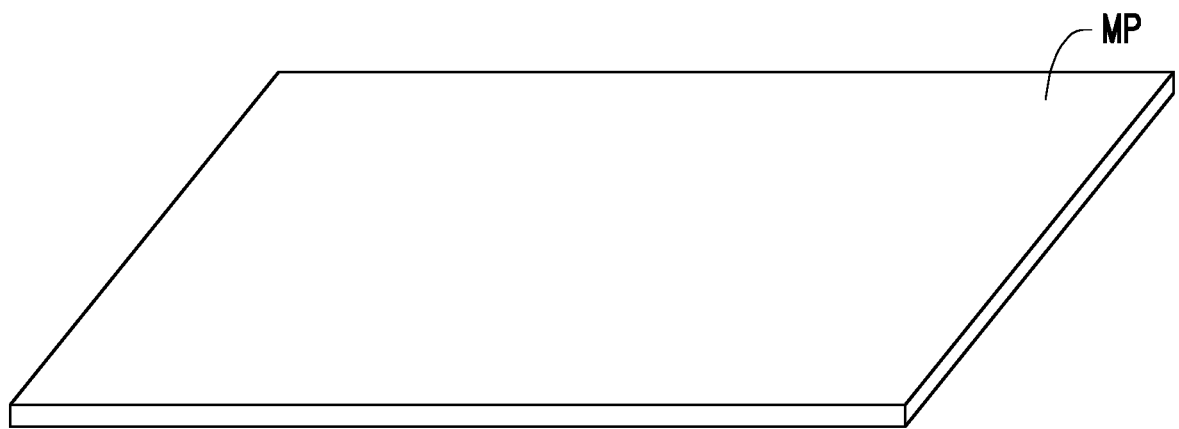

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1I are schematic sectional views of various stages in a method of fabricating a semiconductor device according to some exemplary embodiments of the present disclosure. Referring to FIG. 1A, a conductive plate MP (or metal plate) is provided. In some embodiments, a material of the conductive plate MP is selected from the group consisting of nickel-iron alloy 42 (alloy containing 42% nickel and 58% iron; 42Ni-58Fe), nickel-iron alloy 52 (alloy containing 50.5% nickel and 48.5% iron; 50.5Ni-48.5Fe) and Kovar (nickel-cobalt ferrous alloy containing 29% nickel, 17% cobalt and 54% iron; 29Ni-17Co-54Fe). In certain embodiments, a material of the conductive plate MP is nickel-iron alloy 42 due to a lower coefficient of thermal expansion (CTE). In some embodiments, the conductive plate MP is a material having a coefficient of thermal expansion in a range of 3 ppm/K to 11 ppm/K. In some embodiments, the conductive plate MP is a material having a thermal conductivity in a range of 16 W/mK to 100 W/mk. In certain embodiments, a thickness of the conductive plate MP is in a range of 10 μm to 3000 μm. However, the disclosure is not limited thereto, and the thickness of the conductive plate MP may be adjusted based on product requirement.

Figure 1B:
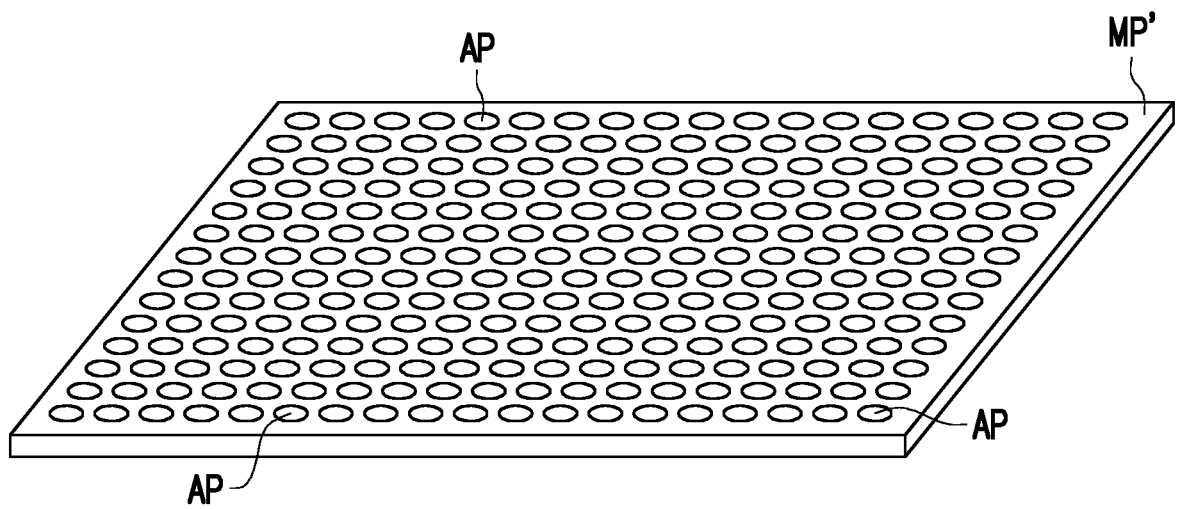

Referring to FIG. 1B, in a next step, the conductive plate MP is patterned to form a patterned conductive plate MP' having a plurality of apertures AP (or through holes). In some embodiments, the apertures AP penetrate through the conductive plate MP. In certain embodiments, a mechanical drilling, punching or chemical etching (such as using $FeCl_3$) process is performed to form the apertures AP that penetrate through the conductive plate MP. After the mechanical drilling, punching or chemical etching process, the apertures AP are formed and arranged in an array on the patterned conductive plate MP'. However, the disclosure is not limited thereto, and in some alternative embodiments, the apertures AP are randomly arranged on the patterned conductive plate MP' based on actual design requirements. The number of apertures AP formed on the patterned conductive plate MP' is not limited thereto, and this may be adjusted based on product requirement.

Figure 1C:
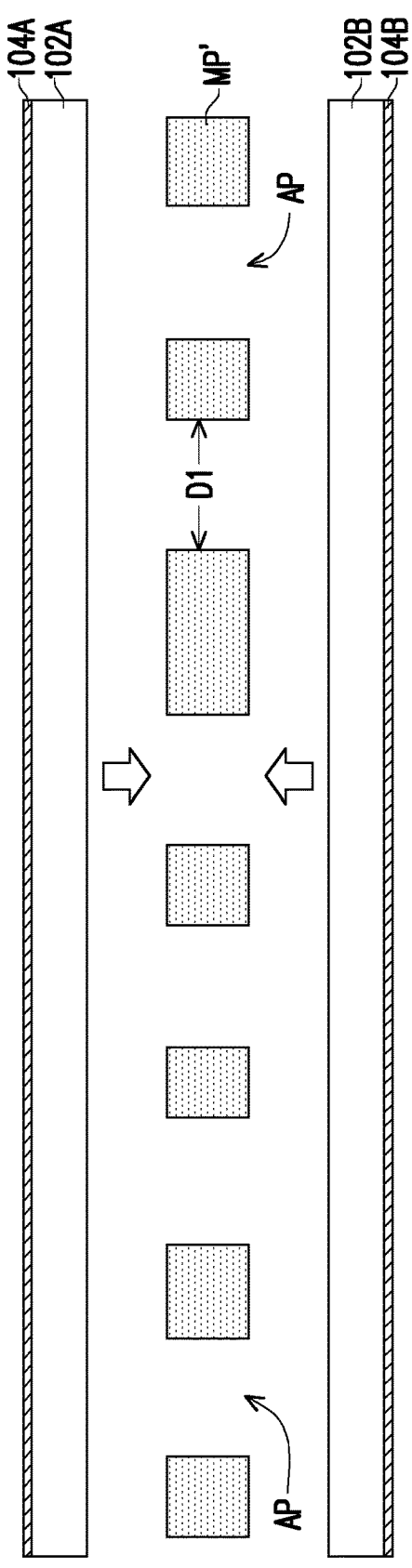
Figure 1D:
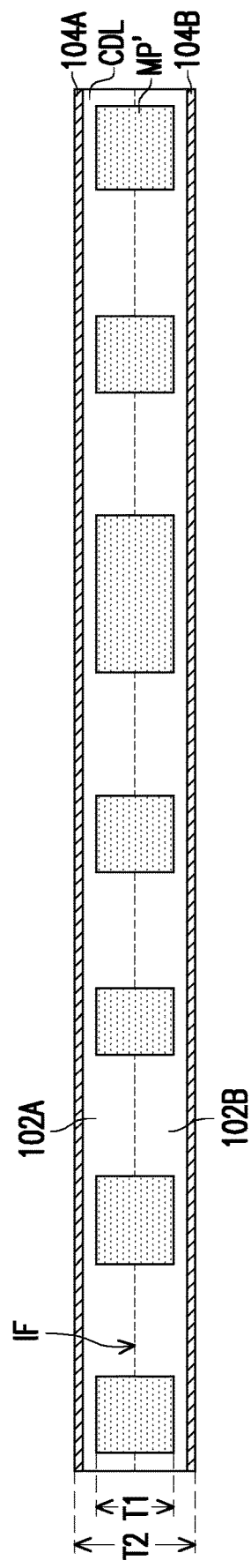

Referring to FIG. 1C, after forming the patterned conductive plate MP', a method of forming a core dielectric material layer is performed. In the exemplary embodiment, a first sub-dielectric material 102A and a second sub-dielectric material 102B are provided on two opposite sides of the patterned conductive plate MP'. The first sub-dielectric material 102A has a core conductive layer 104A coated thereon, and the second sub-dielectric material 102B has a core conductive layer 104B coated thereon. In some embodiments, the patterned conductive plate MP' is arranged in between the first sub-dielectric material 102A and the second sub-dielectric material 102B, on a side without the core conductive layers 104A and 104B. Thereafter, the first sub-dielectric material 102A, the patterned conductive plate MP' and the second sub-dielectric material 102B are laminated together to form a core dielectric material layer CDL as shown in FIG. 1D. In some embodiments, the core dielectric material layer CDL is composed of the first sub-dielectric material 102A and the second sub-dielectric material 102B, and an interface IF exist in between the first sub-dielectric material 102A and the second sub-dielectric material 102B. For example, the interface IF is where the first sub-dielectric material 102A contacts the second sub-dielectric material 102B.

In some embodiments, a material of the first sub-dielectric material 102A and the second sub-dielectric material 102B includes glass fiber, prepreg (which comprises epoxy, resin, and/or glass fiber), resin coated copper (RCC), polyimide, photo image dielectric (PID), or the like. However, the disclosure is not limited thereto, and other dielectric materials may also be used. In some embodiments, a material of the core conductive layers 104A and 104B may include copper, gold, tungsten, aluminum, silver, gold, a combination thereof, and/or the like. In certain embodiments, a conductive material is deposited on surfaces of the first sub-dielectric material 102A and the second sub-dielectric material 102B using any suitable method (e.g., chemical vapor deposition (CVD) sputtering, printing, plating, or the like) to respectively form the core conductive layers 104A and 104B.

As illustrated in FIG. 1C and FIG. 1D, the core dielectric material layer CDL is formed by having the patterned conductive plate MP' embedded therein. In other words, the core dielectric material layer CDL (or the first sub-dielectric material 102A and the second sub-dielectric material 102B) is formed to fill into the apertures AP of the patterned conductive plate MP'. In the exemplary embodiment, a pitch D1 of each of the apertures AP of the patterned conductive plate MP' is in a range of 100 µm to 500 µm. In certain embodiments, the pitch D1 is in a range of 150 µm to 450 µm. Furthermore, in some embodiments, a thickness of the core dielectric material layer CDL is in a range of 60 µm to 4000 µm. In certain embodiments, a ratio of the thickness T1 of the patterned conductive plate MP' to the thickness T2 of the core dielectric material layer CDL is in a range of 1:1.3 to 1:6. By having the core dielectric material layer CDL and the patterned conductive plate MP' controlled in such thickness ratio, good thermal dissipation and warpage control of the circuit board structure can be achieved.

Referring to FIG. 1E, after the lamination process, a plurality of plated through holes TH is formed to penetrate through the core dielectric material layer CDL. In some embodiments, the plated through holes TH may pass through each of the apertures AP of the patterned conductive plate MP', and provide electrical connection to the core conductive layer 104A and the core conductive layer 104B. In other words, the plated through holes TH provide electrical paths between the electrical circuits located on two opposing sides of the core dielectric material layer CDL. In some embodiments, the plated through holes TH may be formed by first forming through holes (not shown) at predetermined positions by, for example, mechanical or laser drilling, etching, or other suitable removal techniques. A desmear treatment may be performed to remove residues remaining in the through holes. Subsequently, the through holes may be plated with conductive materials (e.g., plating copper through electroless plating/electrochemical plating) to a predetermined thickness, thereby providing the plated through holes TH. Thereafter, the plated through holes TH may be filled with insulating materials or conductive materials. In some embodiments, the insulating material includes solder mask material, via plugging material, epoxy, or the like. In certain embodiments, the conductive materials filled in the plated through holes TH may be the same as the material used for plated through holes. At this stage, a first core layer CL1 constituted by the core dielectric material layer CDL, the patterned conductive plate MP', the plated through holes TH, the core conductive layers 104A and 104B is accomplished.

Referring to FIG. 1F, in a next step, conductive materials (not shown) are formed over the core conductive layers 104A and 104B, and formed over the plated through holes TH. For example, the conductive materials are formed on the core conductive layers 104A and 104B by plating (e.g., plating copper through electroless plating/electrochemical plating). In some embodiments, the conductive materials and the core conductive layers 104A and 104B may be patterned together to form conductive lids 105A and 105B that are located over the core conductive layers 104A and 104B respectively. In certain embodiments, portions of the conductive materials and portions of the core conductive layers 104A and 104B may be removed using suitable lithography and etching processes or any suitable removal technique to define patterns correspondingly on a first surface CL1-S1 and a second surface CL1-S2 of the first core layer CL1. In other words, the core conductive layers 104A and 104B located on the first surface CL1-S1 and the second surface CL1-S2 of the first core layer CL1 are patterned to expose portions of the core dielectric material layer CDL underneath. Similarly, the conductive lids 105A and 105B located on the core conductive layers 104A and 104B are also patterned to expose portions of the core dielectric material layer CDL underneath. In some embodiments, the lithography process may include forming a photoresist (not shown) over the conductive materials and the core conductive layers 104A and 104B respectively, patterning the photoresist with openings which correspondingly expose the predetermined regions of each of the conductive materials and the core conductive layers 104A and 104B, and then removing the photoresist. Subsequently, a subtractive etching process, which may be conducted in a single etching step or multiple steps, may be performed to form the patterned core conductive layers 104A and 104B, and the conductive lids 105A and 105B.

Figure 1G:
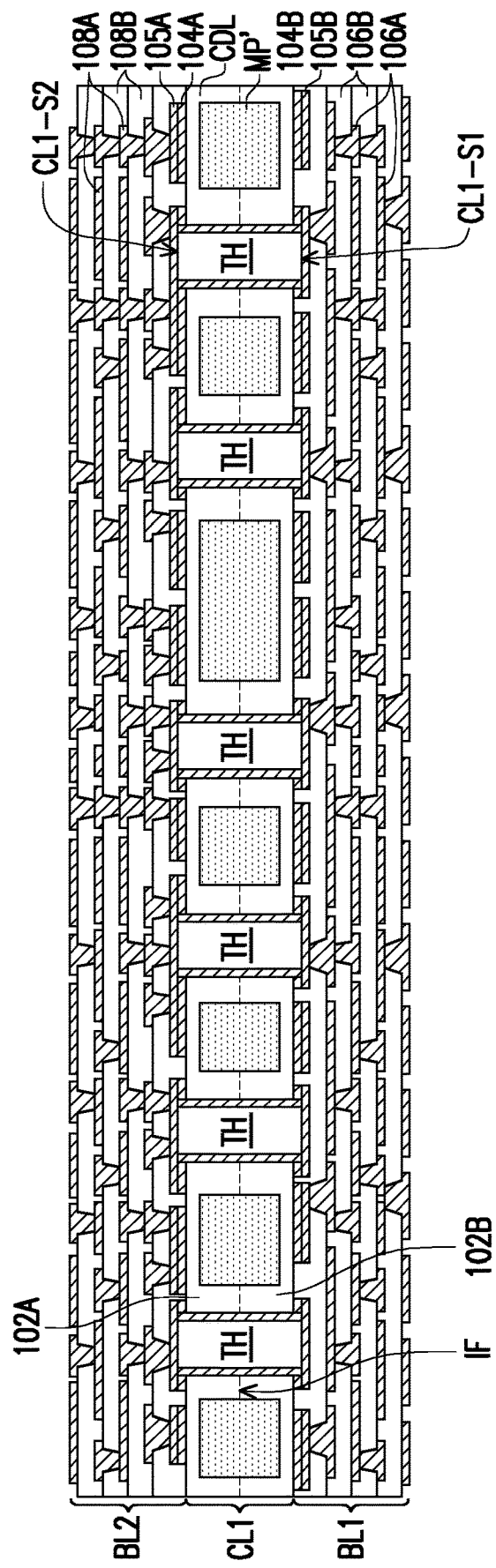

Referring to FIG. 1G, after patterning the core conductive layers 104A and 104B forming the conductive lids 105A and 105B, a first build-up layer BL1 is formed over the first surface CL1-S1 of the first core layer CL1, and a second build-up layer BL2 is formed over the second surface CL1-S2 of the first core layer CL2. In the exemplary embodiment, the formation of the first build-up layer BL1 may include sequentially forming a plurality of first conductive patterns 106A and a plurality of first dielectric layers 106B alternately stacked over the first surface CL1-S1 of the first core layer CL1. Similarly, the formation of the second build-up layer BL2 may include sequentially forming a plurality of second conductive patterns 108A and a plurality of second dielectric layers 108B alternately stacked over the second surface CL1-S2 of the first core layer CL1. Although only four layers of conductive patterns and four layers of dielectric layers are illustrated for each of the first build-up layer BL1 and the second build-up layer BL2, the scope of the disclosure is not limited thereto. In other embodiments, the number of the conductive patterns (106A/108A) and the number of dielectric layers (106B/108B) may be adjusted based on design requirement. In some exemplary embodiments, the total number of layers of the first build-up layer BL1 and the second build-up layer BL2 sums up to a total of 28 to 36 layers for the conductive patterns and dielectric layers. In other words, there may be 28 to 36 layers of the conductive patterns (106A/108A), and 28 to 36 layers of the dielectric layers (106B/108B). In certain embodiments, the number of layers in the first build-up layer BL1 is equal to the number of layers in the second build-up layer BL2.

In the illustrated embodiment, the first build-up layer BL1 and the second build-up layer BL2 are electrically connected to the plated through holes TH. For example, the first conductive patterns 106A and the second conductive patterns 108A may be electrically connected to the plated through holes TH through the core conductive layers 104A and 104B and the conductive lids 105A and 105B. In some embodiments, the patterned conductive plate MP' is isolated by the core dielectric material layer CDL from other components. In other words, the core conductive layers 104A and 104B and the conductive patterns (106A/108A) are electrically isolated from the patterned conductive plate MP'.

In the exemplary embodiment, a material of the dielectric layers (106B/108B) may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the dielectric layers (106B/108B) are formed by suitable fabrication techniques such as spin-on coating, chemical vapor deposition (CVD), plasma-enhanced chemical vapor deposition (PECVD) or the like. The disclosure is not limited thereto.

In some embodiments, a material of the conductive patterns (106A/108A) may be made of conductive materials formed by electroplating or deposition, such as aluminum, titanium, copper, nickel, tungsten, and/or alloys thereof, which may be patterned using a photolithography and etching process. In some embodiments, the conductive patterns (106A/108A) may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

Figure 1H:
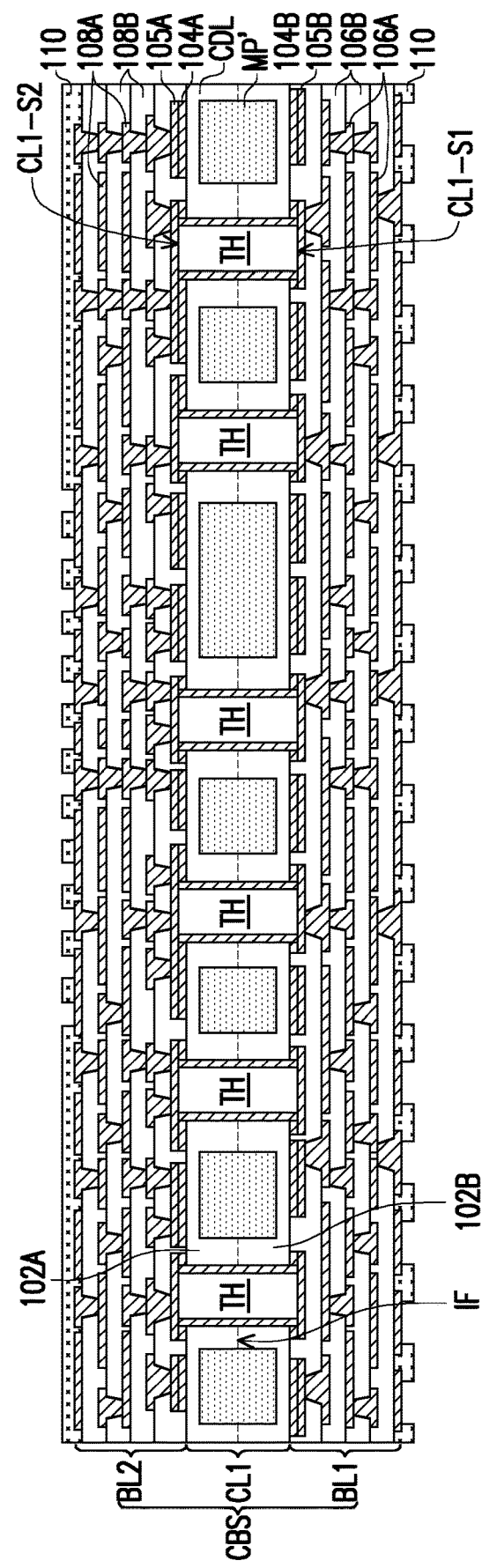

Referring to FIG. 1H, after forming the first build-up layer BL1 and the second build-up layer BL2, a patterned mask layer 110 is optionally formed over the outermost dielectric layers (106B/108B) of the first build-up layer BL1 and the second build-up layer BL2 respectively. For example, the patterned mask layer 110 includes a plurality of openings exposing at least a portion of the outermost dielectric layers (106B/108B). In some embodiments, the patterned mask layer 110 is made of polymeric materials, or other suitable insulating materials. In some embodiments, the patterned mask layer 110 may be formed of materials having a chemical composition of silica, barium sulfate and epoxy resin, and/or the like. For example, the material of the patterned mask layer 110 serving as a solder mask may be selected to withstand the temperatures of molten conductive materials (e.g., solders, metals, and/or metal alloys) to be subsequently disposed within the openings. Up to here, a circuit board structure CBS having a first core layer CL1, and two build-up layers (BL1/BL2) respectively located on two surfaces of the first core layer CL1 is accomplished.

Figure 1I:
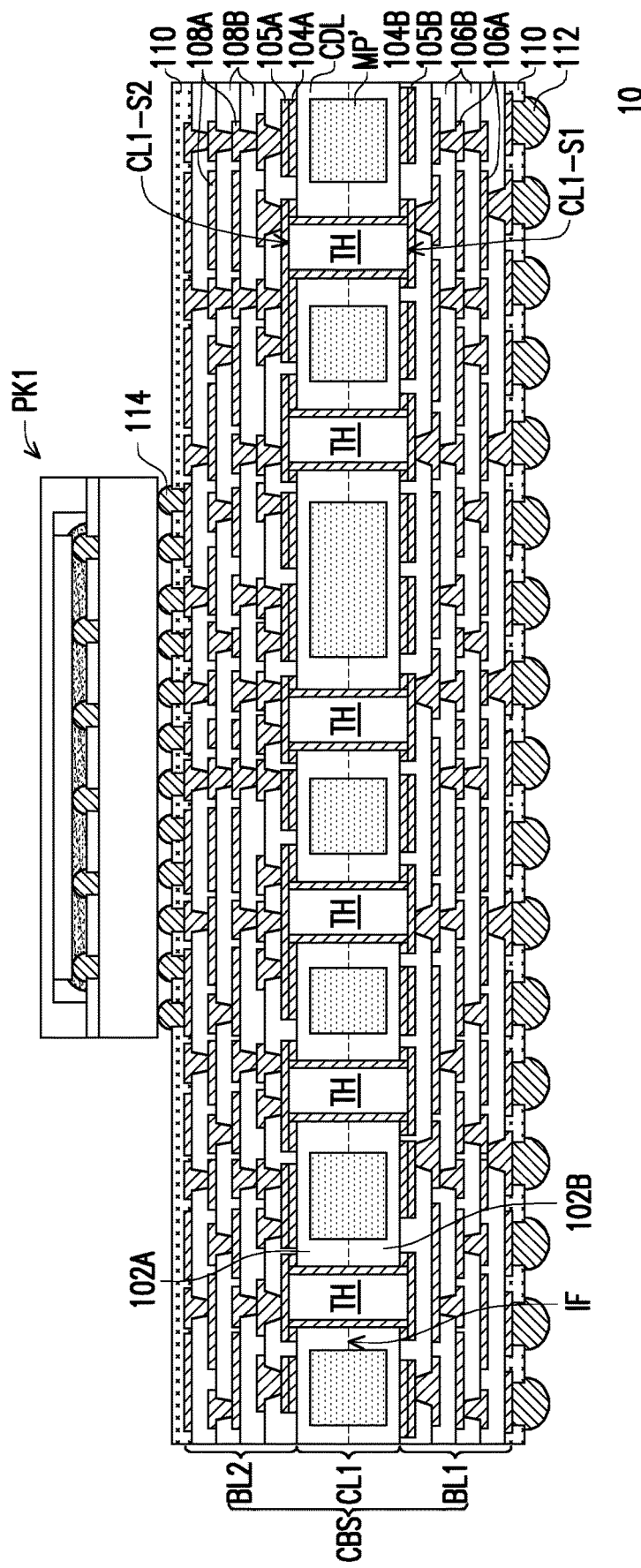

Referring to FIG. 1I, after forming the circuit board structure CBS, a plurality of conductive terminals 112 are disposed in the openings of the patterned mask layer 110 over the first build-up layer BL1, and a plurality of conductive terminals 114 are disposed in the openings of the patterned mask layer 110 over the second build-up layer BL2. Subsequently, a semiconductor package PK1 may be stacked on the circuit board structure CBS to be electrically connected to the circuit board structure CBS through the conductive terminals 114. As such, a semiconductor device 10 having the semiconductor package PK1 stacked on the circuit board structure CBS is fabricated.

In some embodiments, the semiconductor package PK1 may include System-On-Chip (SoC), Chip-On-Wafer (CoW) packages, Integrated-Fan-Out (InFO) packages, Chip-On-Wafer-On-Substrate (CoWoS) packages, other three-dimensional integrated circuit (3DIC) packages, and/or the like. For example, the semiconductor package PK1 may include a wide variety of devices, such as processors, resistors, capacitors, transistors, diodes, fuse devices, memories, discrete electronic devices, power coupling devices or power systems, thermal dissipation devices, and/or the like formed therein. In some embodiments, the conductive terminals 112 and conductive terminals 114 may be ball grid array (BGA) connectors, solder balls, metal pillars, and/or the like. In certain embodiments, the conductive terminals 112 are available to be mounted onto additional electrical components (e.g., circuit carrier, system board, mother board, etc.). In the exemplary embodiment, since the circuit board structure CBS includes the patterned conductive plate MP' embedded in the core dielectric material layer CDL, a good thermal dissipation performance can be achieved due to high thermal conductivity of the patterned conductive plate MP'. Furthermore, a system board warpage can be reduced and good board coplanarity can be achieve due to the reduction of the coefficient of thermal expansion (CTE) of the circuit board structure CBS by use of the patterned conductive plate MP'.

Figure 2:
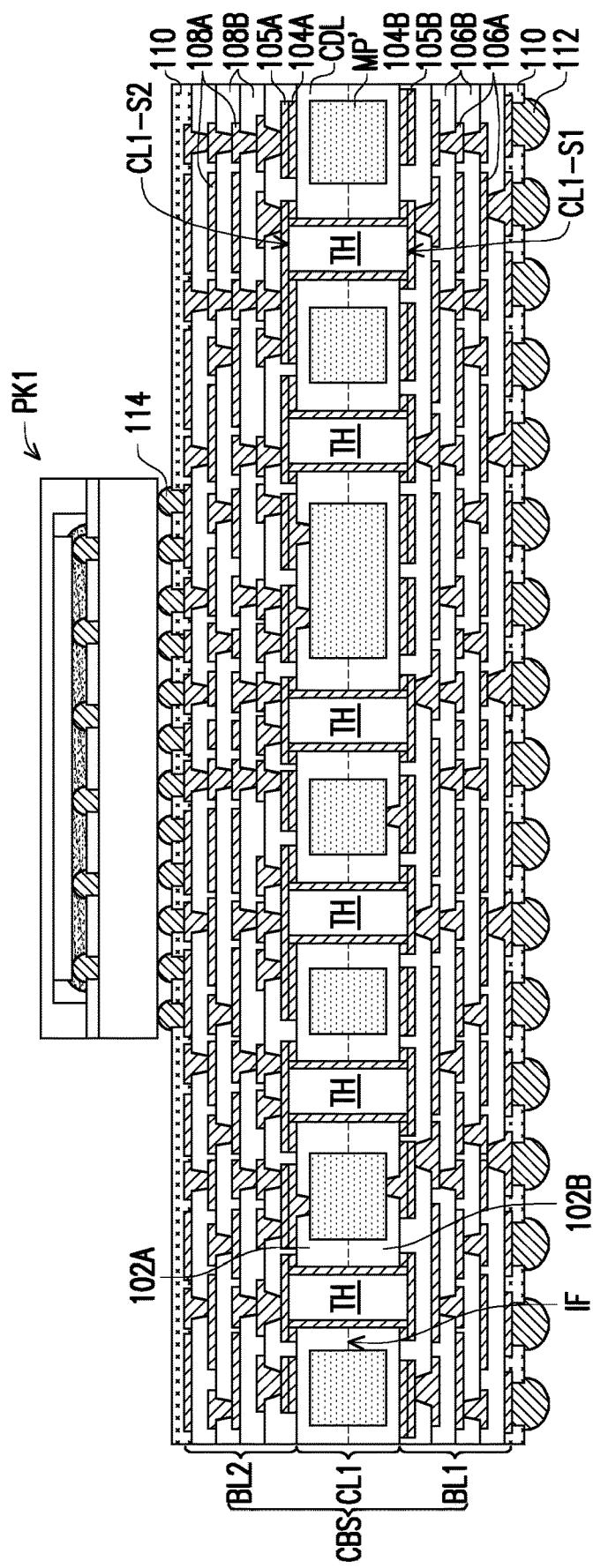
FIG. 2 is a schematic sectional view of a semiconductor device according to some exemplary embodiments of the present disclosure.

FIG. 2 is a schematic sectional view of a semiconductor device according to some exemplary embodiments of the present disclosure. The semiconductor device 20 illustrated in FIG. 2 is similar to the semiconductor device 10 illustrated in FIG. 1I, hence the same reference numerals are used to refer to the same and liked parts, and its detailed description will be omitted herein. The difference between the semiconductor device 10 and the semiconductor device 20 is in the design of the core conductive layers 104A and 104B. For example, in the embodiment shown in FIG. 1I, the patterned conductive plate MP' is isolated by the core dielectric material layer CDL from other components. However, in the embodiment shown in FIG. 2, the core conductive layers 104A and 104B may be further electrically connected to the patterned conductive plate MP'. In other words, the conductive patterns (106A/108A) of the first build-up layer BL1 and the second build-up layer BL2 may also be electrically connected to the patterned conductive plate MP' through the core conductive layers 104A and 104B and the conductive lids 105A and 105B. As such, the thermal dissipation performance of the circuit board structure CBS may be further improved.

FIG. 3A to FIG. 3D are schematic sectional views of various stages in a method of fabricating a semiconductor device according to some other exemplary embodiments of the present disclosure. The embodiment shown in FIG. 3A to FIG. 3D is similar to the embodiment shown in FIG. 1A to FIG. 1I, hence the same reference numerals are used to refer to the same and liked parts, and its detailed description will be omitted herein. In the above embodiments, the core dielectric material layer CDL is formed to have one patterned conductive plate MP' embedded therein. However, the disclosure is not limited thereto. In the current embodiment, two patterned conductive plates are embedded in the core dielectric material layer.

Figure 3A:
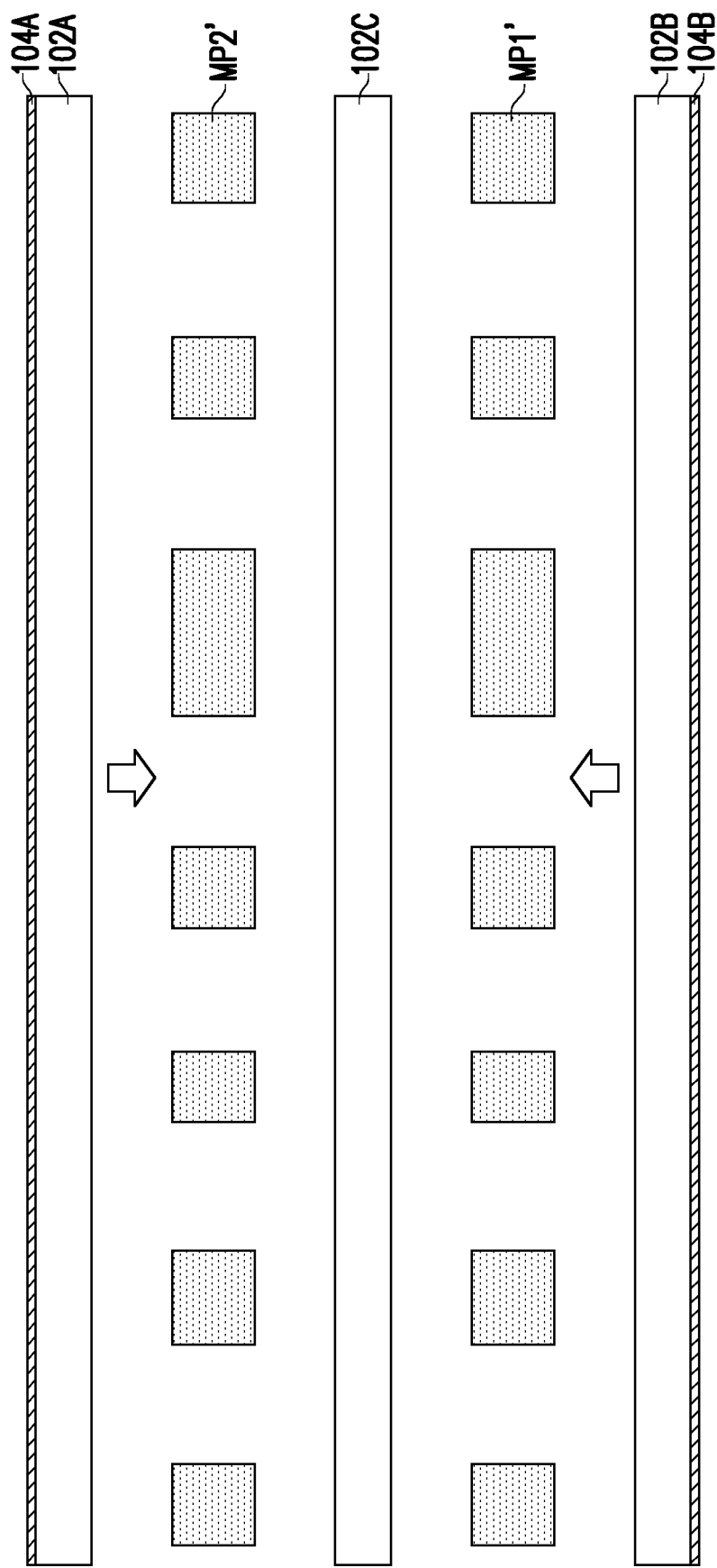
FIG. 3A to FIG. 3D are schematic sectional views of various stages in a method of fabricating a semiconductor device according to some other exemplary embodiments of the present disclosure.

Referring to FIG. 3A, a first patterned conductive plate MP1' and a second patterned conductive plate MP2' are provided. The method of fabricating the first patterned conductive plate MP1' and the second patterned conductive plate MP2' is similar to the method of fabricating the patterned conductive plate MP' described above. For example, both of the first patterned conductive plate MP1' and the second patterned conductive plate MP2' are formed by patterning a conductive plate (not shown) to form a plurality of apertures AP. In the exemplary embodiment, a third sub-dielectric material 102C is provided in between the first patterned conductive plate MP1' and the second patterned conductive plate MP2'. A first sub-dielectric layer 102A is provided over the second patterned conductive plate MP2' on a side opposite to where the third sub-dielectric material 102C is located, and a second sub-dielectric layer 102B is provided over the first patterned conductive plate MP1' on a side opposite to where the third sub-dielectric material 102C is located. The first sub-dielectric material 102A has a core conductive layer 104A coated thereon, and the second sub-dielectric material 102B has a core conductive layer 104B coated thereon, wherein the third sub-dielectric material 102C is free of conductive coatings. Thereafter, the first sub-dielectric material 102A, the second patterned conductive plate MP2', the third sub-dielectric material 102C, the first patterned conductive plate MP1' and the second sub-dielectric material 102B are laminated together so as to form a core dielectric material layer CDL as shown in FIG. 3B.

In some embodiments, the core dielectric material layer CDL is composed of the first sub-dielectric material 102A, the second sub-dielectric material 102B and the third sub-dielectric material 102C, wherein a first interface IF1 exist in between the first sub-dielectric material 102A and the third sub-dielectric material 102C, and a second interface IF2 exist in between the second sub-dielectric material 102B and the third sub-dielectric material 102C. In some embodiments, the first interface IF1 also exist (or is located) in between the first sub-dielectric material 102A and the second sub-dielectric material 102B, and the second interface IF2 also exist (or is located) in between the first sub-dielectric material 102A and the second sub-dielectric material 102B. In certain embodiments, the first interface IF1 is where the first sub-dielectric material 102A contacts the third sub-dielectric material 102C, and the second interface IF2 is where the second sub-dielectric material 102B contacts the third sub-dielectric material 102C.

Figure 3B:
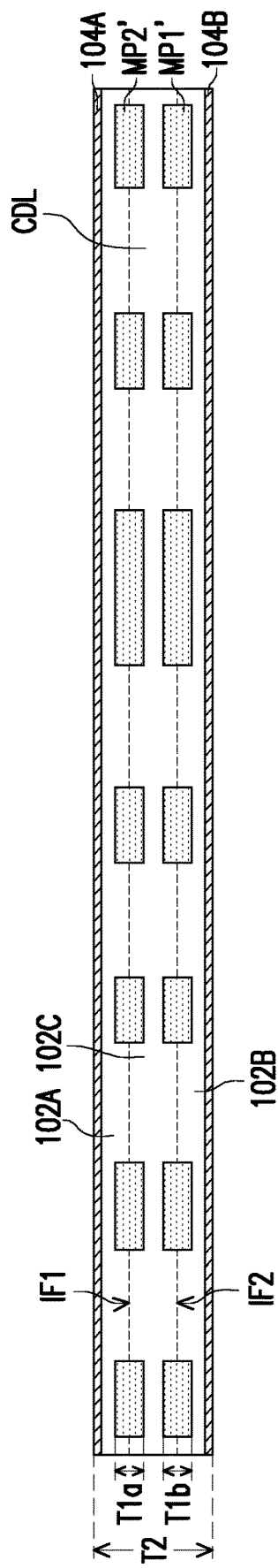

As illustrated in FIG. 3B, two patterned conductive plates (MP1' and MP2') are embedded within the core dielectric material layer CDL. In some embodiments, the two patterned conductive plates (MP1' and MP2') are separated from one another. In other words, the first patterned conductive plate MP1' is not in physical contact with the second patterned conductive plate MP2'. Furthermore, in the exemplary embodiment, the first patterned conductive plate MP1' has a thickness of T1$a$, the second patterned conductive plate MP2' has a thickness of T1$b$, wherein the thickness T1$a$ is substantially equal to the thickness T1$b$. However, the disclosure is not limited thereto, and the thickness T1$a$ may be different to the thickness T1$b$. In some embodiments, a thickness of the core dielectric material layer CDL is T2, wherein a ratio of the thickness T2 of the core dielectric material layer CDL to the thickness (T1$a$+T1$b$) of the patterned conductive plates (MP1' and MP2') is in a range of 1:1.3 to 1:6. As such, good thermal dissipation and warpage control of the circuit board structure can be achieved.

Figure 3C:
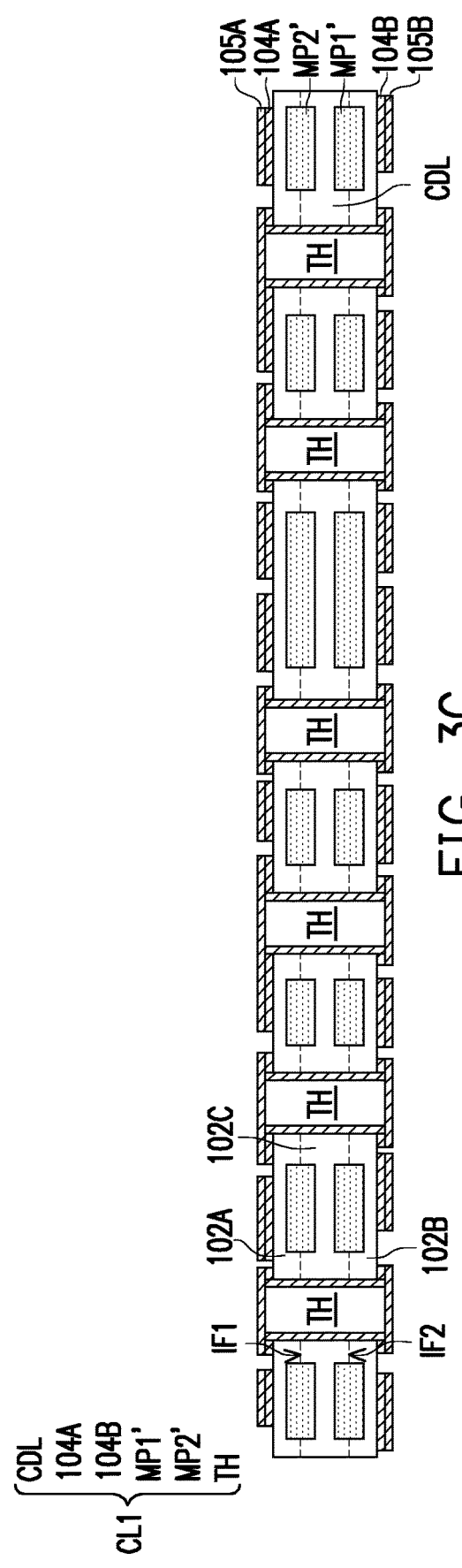

Referring to FIG. 3C, in a next step, a plurality of plated through holes TH are formed to penetrate through the core dielectric material layer CDL. In some embodiments, the plated through holes TH may pass through each of the apertures AP of the first patterned conductive plate MP1' and the second patterned conductive plate MP2', and be electrically connected to the core conductive layer 104A and the core conductive layer 104B. Subsequently, conductive materials (not shown) are formed over the core conductive layers 104A and 104B, and formed over the plated through holes TH, and then patterned to form conductive lids 105A and 105B that are located over the core conductive layers 104A and 104B respectively. The core conductive layers 104A and 104B located on the first surface CL1-S1 and the second surface CL1-S2 of the first core layer CL1 are patterned to expose portions of the core dielectric material layer CDL underneath. For example, the core conductive layers 104A and 104B may be patterned through the lithography and subtractive etching processes described above.

Figure 3D:
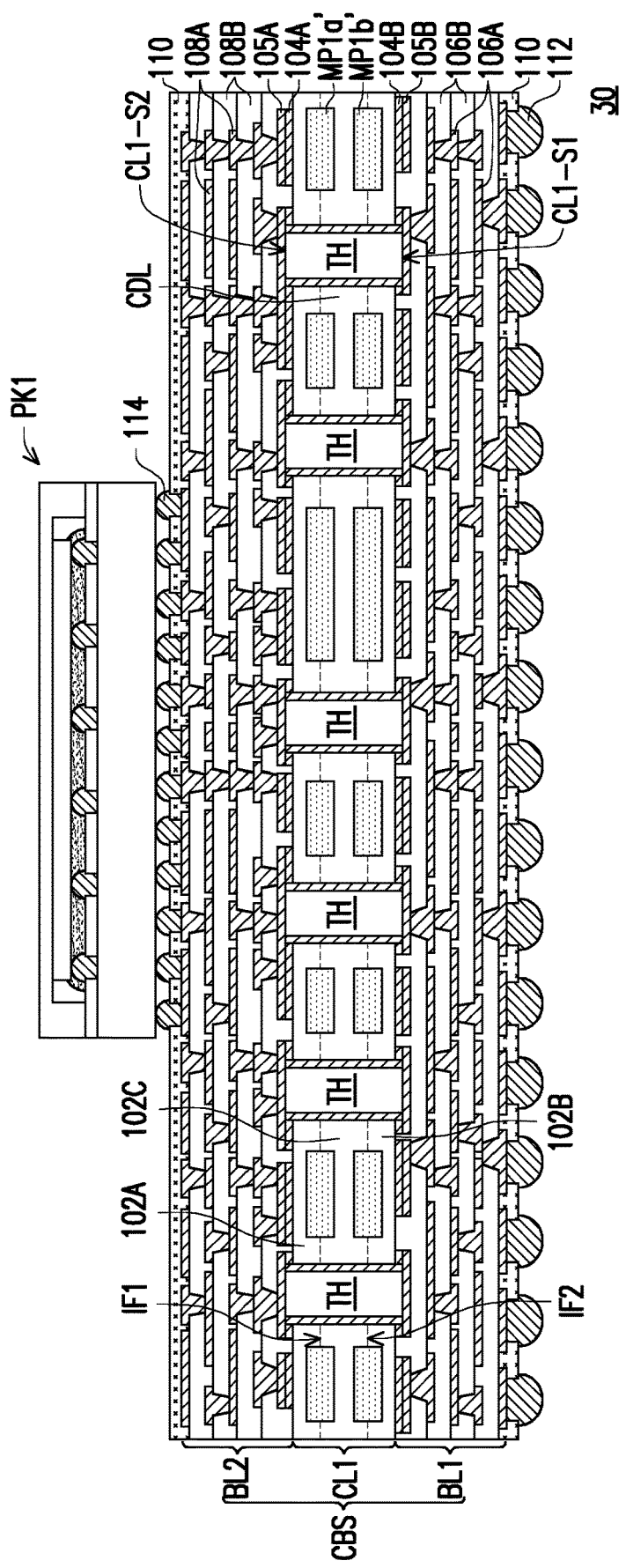

Referring to FIG. 3D, after forming the first core layer CL1 having two patterned conductive plates (MP1' and MP2') embedded in the core dielectric material layer CDL, the same processes for forming the first build-up layer BL1, the second build-up layer BL2, the conductive terminals 112 and 114, and the same steps of stacking the semiconductor package PK1 onto the circuit board structure CBS may be performed to fabricate a semiconductor device 30 according to another exemplary embodiment of the disclosure. In the exemplary embodiment, the two patterned conductive plates (MP1' and MP2') are isolated by the core dielectric material layer CDL from other components. However, the disclosure is not limited thereto. In some other embodiments, the core conductive layers 104A and 104B may be further electrically connected to the two patterned conductive plates (MP1' and MP2') respectively.

Figure 4A:
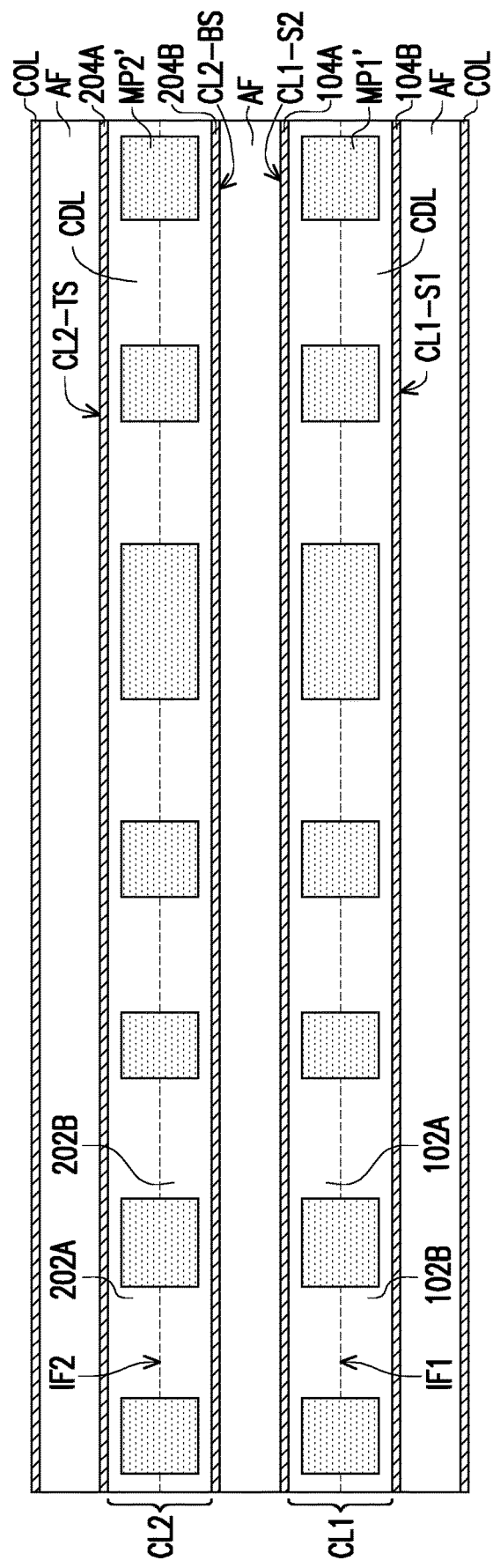
FIG. 4A to FIG. 4C are schematic sectional views of various stages in a method of fabricating a semiconductor device according to some other exemplary embodiments of the present disclosure.
Figure 4B:
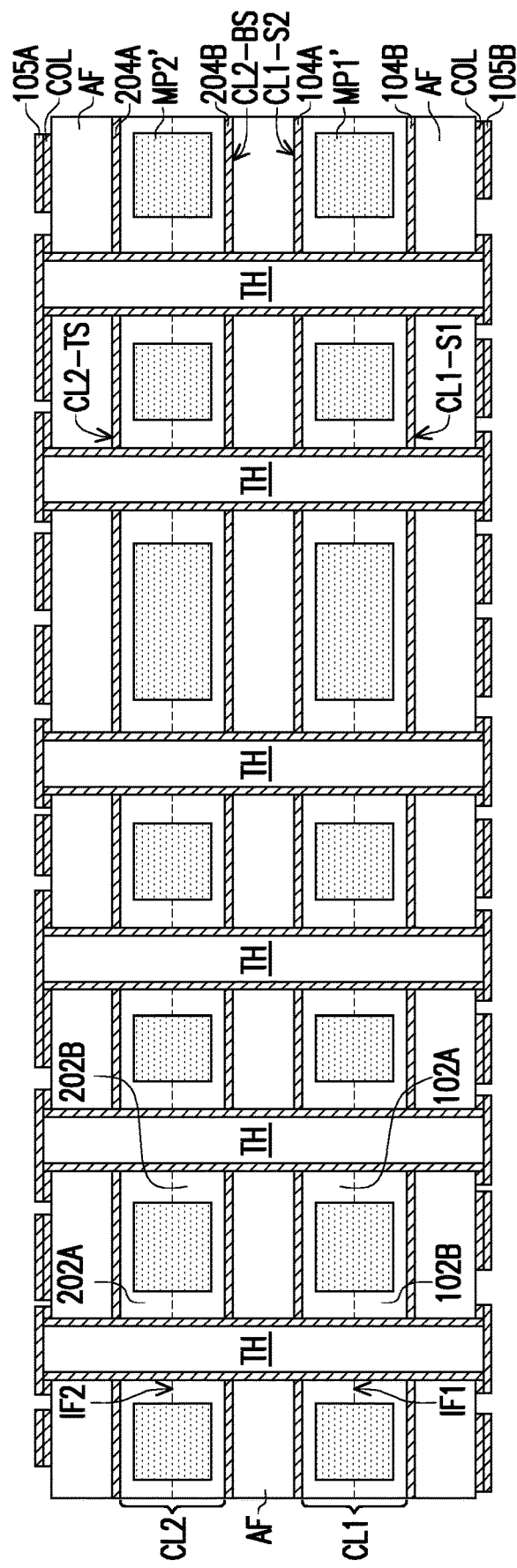
Figure 4C:
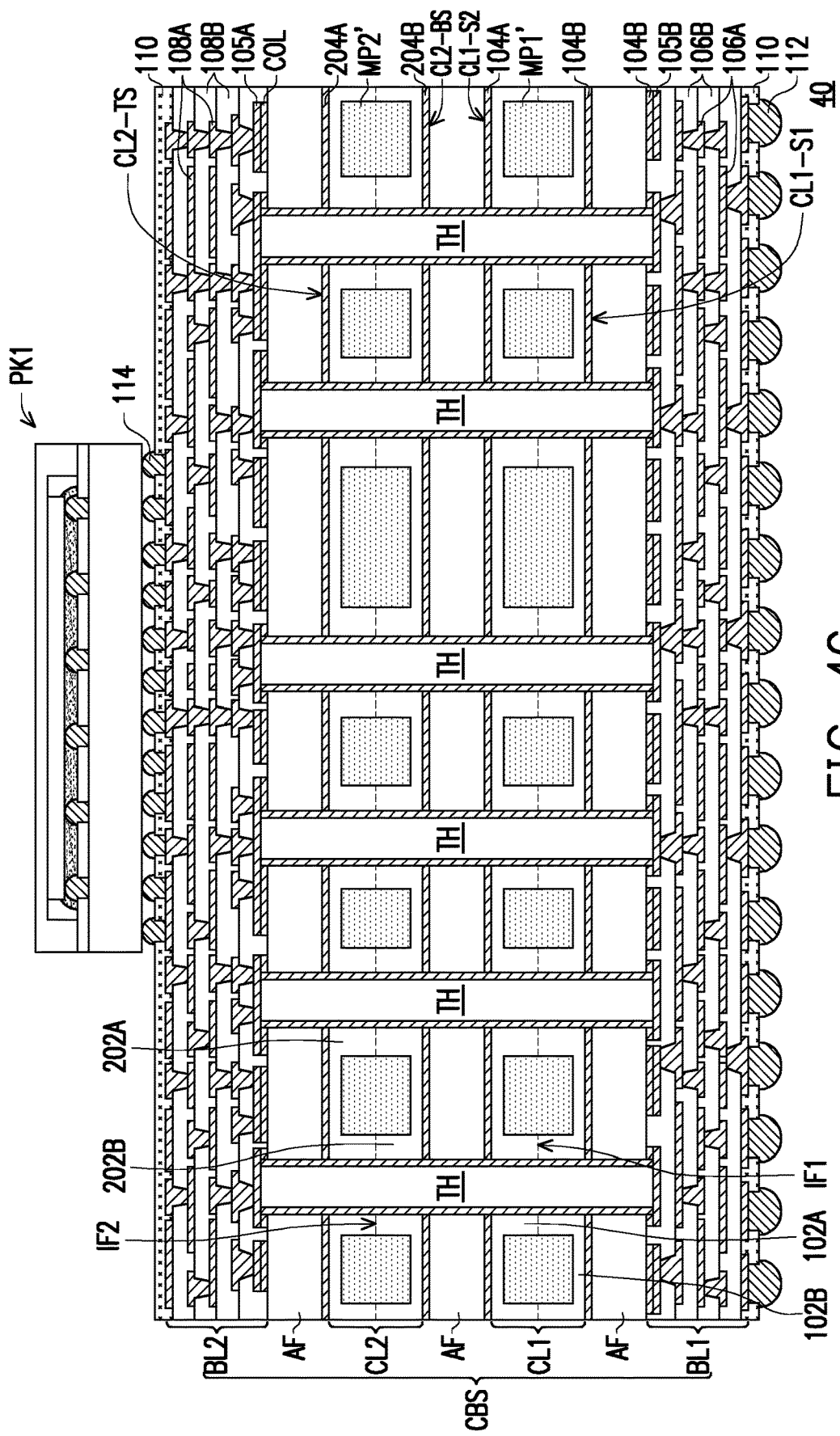

FIG. 4A to FIG. 4C are schematic sectional views of various stages in a method of fabricating a semiconductor device according to some other exemplary embodiments of the present disclosure. The embodiment shown in FIG. 4A to FIG. 4C is similar to the embodiment shown in FIG. 1A to FIG. 1I, hence the same reference numerals are used to refer to the same and liked parts, and its detailed description will be omitted herein. The difference between the embodiment shown in FIG. 4A to FIG. 4C and the embodiment shown in FIG. 1A to FIG. 1I is in the number of core layers in the circuit board structure CBS.

Referring to FIG. 4A, to form a first core layer CL1, a first patterned conductive plate MP1' embedded in a core dielectric material layer CDL and having core conductive layers 104A, 104B coated thereon are formed in the same way as described for the structure shown in FIG. 1D. For example, the core dielectric material layer CDL of the first core layer CL1 is composed of a first sub-dielectric material 102A, a second sub-dielectric material 102B, wherein an interface IF1 exist in between the first sub-dielectric material 102A and the second sub-dielectric layer 102B. In a similar way, to form a second core layer CL2, a second patterned conductive plate MP2' embedded in a core dielectric material layer CDL and having core conductive layers 204A, 204B coated thereon are formed in the same way as described for the structure shown in FIG. 1D. For example, the core dielectric material layer CDL of the second core layer CL2 is composed of a first sub-dielectric material 202A, a second sub-dielectric material 202B, wherein an interface IF2 exist in between the first sub-dielectric material 202A and the second sub-dielectric layer 202B.

In the exemplary embodiment, the first core layer CL1 has a first surface CL1-S1 and a second surface CL1-S1 opposite to the first surface CL1-S1. Similarly, the second core layer CL2 has a top surface CL2-TS and a bottom surface CL2-BS opposite to the top surface CL2-TS. In some embodiments, the bottom surface CL2-BS of the second core layer CL2 is attached to the second surface CL1-S2 of the first core layer CL1 through an adhesive film AF. For example, the core conductive layer 204B of the second core layer CL2 is bonded to the core conductive layer 104A of the first core layer CL1 through the adhesive film AF. Furthermore, additional adhesive films AF having conductive layers COL coated thereon are formed over the first surface CL1-S1 of the first core layer CL1 and over the top surface CL2-TS of the second core layer CL2 respectively. In some embodiments, a material used for the adhesive films AF include carboxylic esters, carbonic esters or organic peroxides, however, the disclosure is not limited thereto. In alternative embodiments, the adhesive film AF may be any material suitable for attaching the second core layer CL2 to the first core layer CL1.

Referring to FIG. 4B, in a subsequent step, a plurality of plated through holes TH are formed to penetrate through the first core layer CL1 and the second core layer CL2. For example, the plated through holes TH may pass through each of the apertures AP (as defined in FIG. 1C) of the first patterned conductive plate MP1' and the second patterned conductive plate MP2', and be electrically connected to the core conductive layer 104B and the core conductive layer 204A. Furthermore, the plated through holes TH are formed to penetrate through the core conductive material layers CDL of the first core layer CL1 and the second core layer CL2, and to penetrate through all of the adhesive films AF. Subsequently, conductive materials (not shown) are formed over the conductive layers COL, and formed over the plated through holes TH, and then patterned to form conductive lids 105A and 105B that are located over the conductive layers COL respectively. The conductive layers COL are patterned to expose portions of the adhesive film AF underneath. For example, the conductive layers COL may be patterned through the lithography and subtractive etching processes described above.

Referring to FIG. 4C, after forming the first core layer CL1, the second core layer CL2 and the adhesive films AF, the same processes for forming the first build-up layer BL1, the second build-up layer BL2, the conductive terminals 112 and 114, and the same steps of stacking the semiconductor package PK1 onto the circuit board structure CBS may be performed to fabricate a semiconductor device 40 according to another exemplary embodiment of the disclosure. In the exemplary embodiment, the patterned conductive plates (MP1' and MP2') of the first core layer CL1 and the second core layer CL2 are isolated by the core dielectric material layer CDL from other components respectively. However, the disclosure is not limited thereto. In some other embodiments, the core conductive layer 204A may be further electrically connected to the second patterned conductive plate MP2', whereas the core conductive layer 104B may be further electrically connected to the first patterned conductive plate MP1' for improving thermal dissipation.

Figure 5:
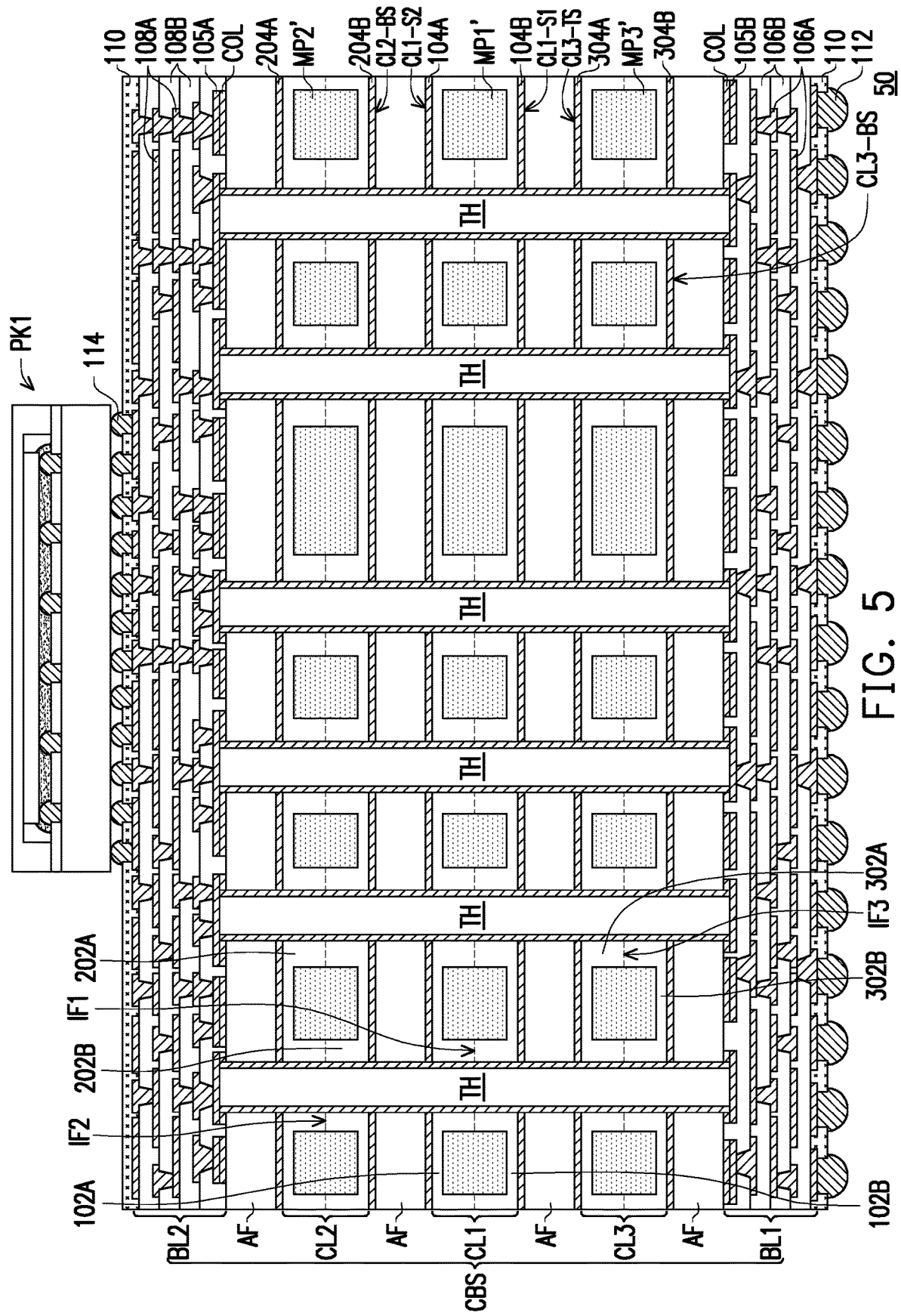
FIG. 5 is a schematic sectional view of a semiconductor device according to some exemplary embodiments of the present disclosure.

FIG. 5 is a schematic sectional view of a semiconductor device according to some exemplary embodiments of the present disclosure. The embodiment shown in FIG. 5 is similar to the embodiment shown in FIG. 4A to FIG. 4C, hence the same reference numerals are used to refer to the same and liked parts, and its detailed description will be omitted herein. The difference between the embodiment of FIG. 5 and the embodiment of FIG. 4A to FIG. 4C is in the number of core layers in the circuit board structure CBS.

Referring to FIG. 5, to form a first core layer CL1, a first patterned conductive plate MP1' embedded in a core dielectric material layer CDL and having core conductive layers 104A, 104B coated thereon are formed in the same way as described for the structure shown in FIG. 1D. In a similar way, to form a second core layer CL2, a second patterned conductive plate MP2' embedded in a core dielectric material layer CDL and having core conductive layers 204A, 204B coated thereon are formed in the same way as described for the structure shown in FIG. 1D. Similarly, to form a third core layer CL3, a third patterned conductive plate MP3' embedded in a core dielectric material layer CDL and having core conductive layers 304A, 304B coated thereon are formed in the same way as described for the structure shown in FIG. 1D. For example, the core dielectric material layer CDL of the third core layer CL3 is composed of a first sub-dielectric material 302A, a second sub-dielectric material 302B, wherein an interface IF3 exist in between the first sub-dielectric material 302A and the second sub-dielectric layer 302B. In the exemplary embodiment, the bottom surface CL2-BS of the second core layer CL2 is attached to the second surface CL1-S2 of the first core layer CL1 through an adhesive film AF. Furthermore, a top surface CL3-TS of the third core layer CL3 is attached to the first surface CL1-S1 of the first core layer CL1 through an adhesive film AF. Furthermore, additional adhesive films AF having conductive layers COL coated thereon are formed over the second core layer CL2 and over the third core layer CL3 respectively.

Subsequently, a plurality of plated through holes TH are formed to penetrate through the first core layer CL1, the second core layer CL2, the third core layer CL3 and the adhesive films AF. That is, the plated through holes TH may pass through each of the apertures AP of the first patterned conductive plate MP1', the second patterned conductive plate MP2' and the third patterned conductive plate MP3', and pass through the adhesive films AF and be electrically connected to the conductive layers COL located on opposing sides. After forming the first core layer CL1, the second core layer CL2 and the third core layer CL3, the same processes for forming the conductive lids 105A and 105B, the first build-up layer BL1, the second build-up layer BL2, the conductive terminals 112 and 114, and the same steps of stacking the semiconductor package PK1 onto the circuit board structure CBS may be performed to fabricate a semiconductor device 50 according to another exemplary embodiment of the disclosure. In the exemplary embodiment, the patterned conductive plates (MP1', MP2' and MP3') of the first core layer CL1, the second core layer CL2 and the third core layer CL3 are isolated by the core dielectric material layer CDL from other components respectively. However, the disclosure is not limited thereto. In some other embodiments, the core conductive layer 204A may be further electrically connected to the second patterned conductive plate MP2', and the core conductive layer 304B may be further electrically connected to the third patterned conductive plate MP3' for improving thermal dissipation. Furthermore, the core conductive layer 104A or 104B may be optionally connected to the first patterned conductive plate MP1' for improving thermal dissipation.

Figure 6:
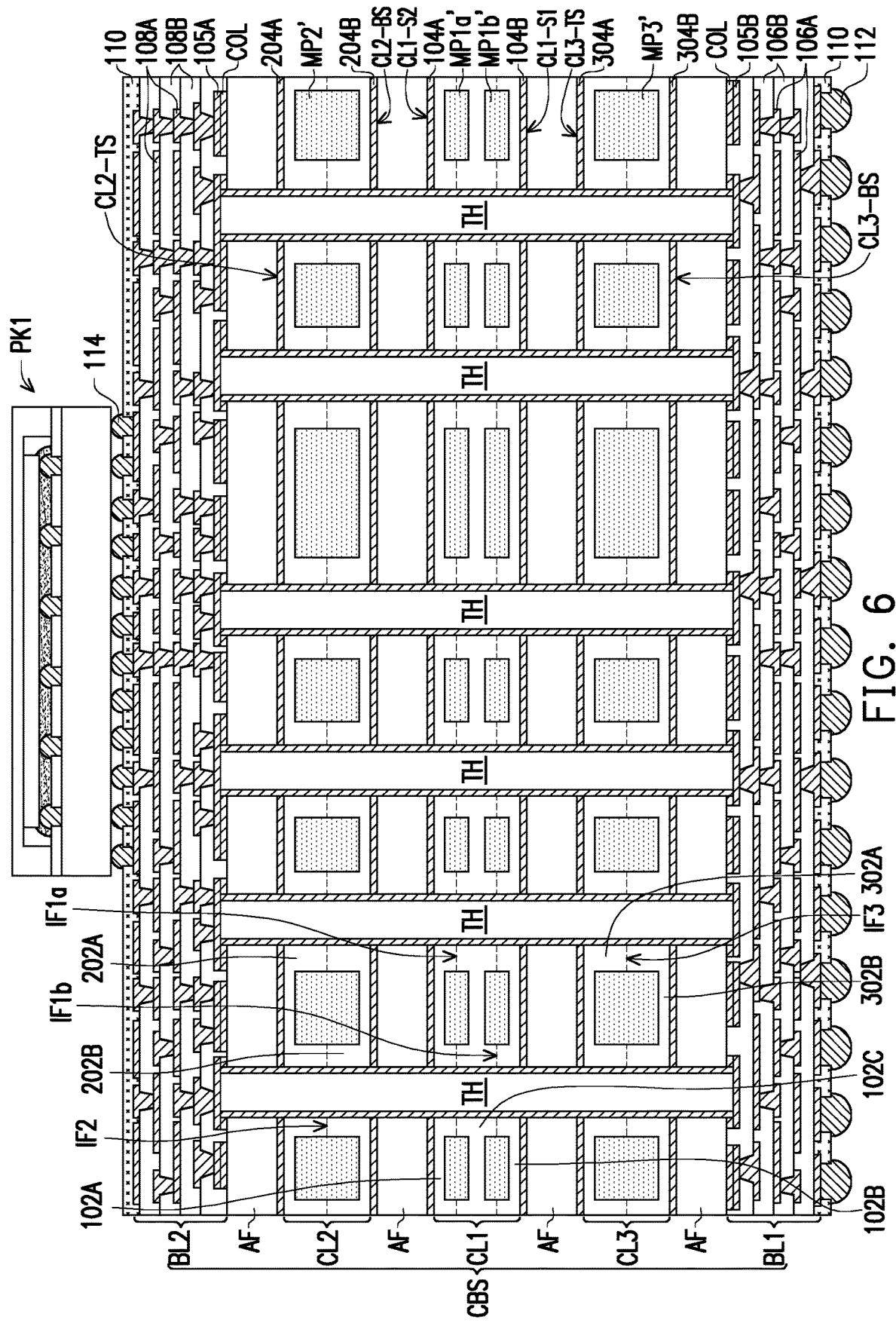
FIG. 6 is a schematic sectional view of a semiconductor device according to some exemplary embodiments of the present disclosure.

FIG. 6 is a schematic sectional view of a semiconductor device according to some exemplary embodiments of the present disclosure. The embodiment shown in FIG. 6 is similar to the embodiment shown in FIG. 5, hence the same reference numerals are used to refer to the same and liked parts, and its detailed description will be omitted herein. The difference between the embodiment of FIG. 6 and the embodiment of FIG. 5 is in the design of the core layers in the circuit board structure CBS. In the embodiment shown in FIG. 5, each of the core layers (CL1, CL2 and CL3) have one conductive plate embedded in the core dielectric material. However, the disclosure is not limited thereto. In the embodiment shown in FIG. 6, the first core layer CL1 has two patterned conductive plates (MP1a' and MP1b') embedded in the core dielectric material layer CDL. Furthermore, the core dielectric material layer CDL of the first core layer CL1 is composed of the first sub-dielectric material 102A, the second sub-dielectric material 102B and the third sub-dielectric material 102C, wherein a first interface IF1a exist in between the first sub-dielectric material 102A and the third sub-dielectric material, and a second interface IF1b exist in between the second sub-dielectric material and the third sub-dielectric material.

In some embodiments, the first interface IF1a also exist (or is located) in between the first sub-dielectric material 102A and the second sub-dielectric material 102B, and the second interface IF1b also exist (or is located) in between the first sub-dielectric material 102A and the second sub-dielectric material 102B. In certain embodiments, the first interface IF1a is where the first sub-dielectric material 102A contacts the third sub-dielectric material 102C, and the second interface IF1b is where the second sub-dielectric material 102B contacts the third sub-dielectric material 102C.

The method of fabricating the first core layer CL1 having two patterned conductive plates (MP1a' and MP1b') embedded therein is similar to the method as described in FIG. 3A to FIG. 3C. In the exemplary embodiment, the three core layers (CL1, CL2 and CL3) may be attached to one another using the adhesive films AF as described above. Subsequently, a plurality of plated through holes TH may be formed to penetrate through the core layers (CL1, CL2 and CL3) and the adhesive films AF. The same processes for forming the conductive lids 105A and 105B, the first build-up layer BL1, the second build-up layer BL2, the conductive terminals 112 and 114, and the same steps of stacking the semiconductor package PK1 onto the circuit board structure CBS may then be performed to fabricate a semiconductor device 60 according to another exemplary embodiment of the disclosure.

In the above embodiments, it should be noted that the number of core layers, and the number of conductive plates embedded within the core layers is not particularly limited, and this may be adjusted based on product requirement. By designing a circuit board structure having at least one conductive plate embedded in the core dielectric material layer, a good thermal dissipation performance can be achieved. The good thermal dissipation properties arise from the high thermal conductivity of the patterned conductive plates. Furthermore, by using patterned conductive plates having the designated coefficient of thermal expansion (CTE), the stress and warpage due to CTE mismatch may be significantly reduced. As such, an ideal system board warpage and board coplanarity can be achieved.

In accordance with some embodiments of the present disclosure, a circuit board structure including a first core layer, a first build-up layer and a second build-up layer is provided. The first core layer has a first surface and a second surface opposite to the first surface, wherein the first core layer includes a core dielectric material layer and at least one patterned conductive plate embedded within the core dielectric material layer, the core dielectric material layer comprises a first sub-dielectric material and a second sub-dielectric material, and at least one interface exists in between the first sub-dielectric material and the second sub-dielectric material. The first build-up layer is disposed on the first surface of the first core layer, and the second build-up layer is disposed on the second surface of the first core layer.

In accordance with another embodiment of the present disclosure, a semiconductor device including a circuit board structure and a semiconductor package is provided. The circuit board structure includes a first core layer, a plurality of first conductive patterns, a plurality of first dielectric layers, a plurality of second conductive patterns and a plurality of second dielectric layers. The first core layer has a first surface and a second surface opposite to the first surface, wherein the first core layer includes a core dielectric material layer, at least one patterned conductive plate embedded within the core dielectric material layer, and core conductive layers coated over surfaces of the core dielectric material layer and located at the first surface and the second surface of the first core layer, wherein the patterned conductive plate has a coefficient of thermal expansion in a range of 3 ppm/K to 11 ppm/K. The plurality of first conductive patterns and the plurality of first dielectric layers are alternately stacked over the first surface of the first core layer. The plurality of second conductive patterns and the plurality of second dielectric layers are alternately stacked over the second surface of the first core layer. The semiconductor package is stacked on the circuit board structure and electrically connected to the circuit board structure.

In accordance with yet another embodiment of the present disclosure, a method of fabricating a circuit board structure is described. The method includes the following steps. A first core layer is formed to have a first surface and a second surface opposite to the first surface. The first core layer is formed by the following steps. A conductive plate is provided. The conductive plate is patterned to form a first patterned conductive plate having a plurality of apertures, wherein the first patterned conductive plate has a coefficient of thermal expansion in a range of 3 ppm/K to 11 ppm/K. A core dielectric material layer is formed to cover the first patterned conductive plate and to fill into the apertures of the first patterned conductive plate. A first build-up layer is formed over the first surface of the first core layer. A second build-up layer is formed over the second surface of the first core layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit board structure, comprising:
   a first core layer having a first surface and a second surface opposite to the first surface, wherein the first core layer comprises a core dielectric material layer and at least one patterned conductive plate embedded within the core dielectric material layer, the core dielectric material layer comprises a first sub-dielectric material and a second sub-dielectric material, and at least one interface exists in between the first sub-dielectric material and the second sub-dielectric material;
   a second core layer having a top surface and a bottom surface opposite to the top surface, wherein the second core layer comprises a core dielectric material layer and at least one patterned conductive plate embedded within the core dielectric material layer, and the bottom surface of the second core layer is attached to the second surface of the first core layer through an adhesive film;
   a first build-up layer disposed on the first surface of the first core layer; and
   a second build-up layer disposed on the top surface of the second core layer,
   wherein the at least one patterned conductive plate of the first core layer is electrically isolated by the core dielectric material layer from the first build-up layer and the second build-up layer.

2. The circuit board structure according to claim 1, wherein a material of the at least one patterned conductive plate is selected from the group consisting of nickel-iron alloy 42, nickel-iron alloy 52 and nickel-cobalt ferrous alloy.

3. The circuit board structure according to claim 1, wherein the first core layer comprises two patterned conductive plates embedded within the core dielectric material layer, the two patterned conductive plates are physically separated from one another, and wherein the core dielectric material layer further comprises a third sub-dielectric material located in between the first sub-dielectric material and the second sub-dielectric material, and a first interface exist in between the first sub-dielectric material and the third sub-dielectric material, and a second interface exist in between the second sub-dielectric material and the third sub-dielectric material.

4. The circuit board structure according to claim 1, wherein the second core layer comprises two patterned conductive plates embedded within the core dielectric material layer, and the two patterned conductive plates are physically separated from one another.

5. The circuit board structure according to claim 1, further comprising a third core layer having a top surface and a bottom surface opposite to the top surface, wherein the third core layer comprises a core dielectric material layer and at least one patterned conductive plate embedded within the core dielectric material layer, and the top surface of the third core layer is attached to the first surface of the first core layer through an adhesive film.

6. The circuit board structure according to claim 1, wherein the first build-up layer comprises a plurality of first conductive patterns and a plurality of first dielectric layers alternately stacked over the first surface of the first core layer, the second build-up layer comprises a plurality of second conductive patterns and a plurality of second dielectric layers alternately stacked over the second surface of the first core layer, and the first patterned conductive plate is electrically isolated by the core dielectric material layer from the plurality of first conductive patterns and the plurality of second conductive patterns.

7. The circuit board structure according to claim 1, wherein the at least one patterned conductive plate has a thermal conductivity in a range of 16 W/mK to 100 W/mk.

8. A semiconductor device, comprising:
   a circuit board structure, comprising:
      a first core layer having a first surface and a second surface opposite to the first surface, wherein the first core layer comprises a core dielectric material layer, at least one patterned conductive plate embedded within the core dielectric material layer, and core conductive layers coated over surfaces of the core dielectric material layer and located at the first surface and the second surface of the first core layer, wherein the patterned conductive plate includes a material selected from the group consisting of nickel-iron alloy 42, nickel-iron alloy 52 and nickel-cobalt ferrous alloy having a coefficient of thermal expansion in a range of 3 ppm/K to 11 ppm/K, and a material of the core conductive layers is different than the material of the patterned conductive plate;
      a plurality of first conductive patterns and a plurality of first dielectric layers alternately stacked over the first surface of the first core layer; and
      a plurality of second conductive patterns and a plurality of second dielectric layers alternately stacked over the second surface of the first core layer; and
   a semiconductor package stacked on the circuit board structure and electrically connected to the circuit board structure.

9. The semiconductor device according to claim 8, wherein the circuit board structure further comprises a plurality of plated through holes penetrating through the first core layer and electrically connected to the core conductive layers located at the first surface and the second surface of the first core layer.

10. The semiconductor device according to claim 8, wherein the first core layer comprises two patterned conductive plates embedded within the core dielectric material layer, and the two patterned conductive plates are physically separated from one another.

11. The semiconductor device according to claim 8, further comprising a second core layer having a top surface and a bottom surface opposite to the top surface, wherein the second core layer comprises a core dielectric material layer, at least one patterned conductive plate embedded within the core dielectric material layer, and core conductive layers coated over surfaces of the core dielectric material layer and located at the top surface and the bottom surface of the second core layer, and the bottom surface of the second core layer is attached to the second surface of the first core layer through an adhesive film.

12. The semiconductor device according to claim 11, further comprising a third core layer having a top surface and a bottom surface opposite to the top surface, wherein the third core layer comprises a core dielectric material layer, at least one patterned conductive plate embedded within the core dielectric material layer, and core conductive layers coated over surfaces of the core dielectric material layer and located at the top surface and the bottom surface of the third core layer, and the top surface of the third core layer is attached to the first surface of the first core layer through an adhesive film.

13. The semiconductor device according to claim 8, further comprising conductive terminals disposed on and physically attached to the plurality of first conductive patterns and the plurality of second conductive patterns.

14. The semiconductor device according to claim 8, further comprising:
    patterned mask layers disposed on the plurality of first conductive patterns and the plurality of first dielectric layers, and on the plurality of second conductive patterns and the plurality of second dielectric layers.

15. A method of fabricating a circuit board structure, comprising:
    forming a first core layer having a first surface and a second surface opposite to the first surface, wherein forming the first core layer comprises:
        patterning a conductive plate to form a first patterned conductive plate having a plurality of apertures, wherein the first patterned conductive plate includes a material selected from the group consisting of nickel-iron alloy 42, nickel-iron alloy 52 and nickel-cobalt ferrous alloy having a coefficient of thermal expansion in a range of 3 ppm/K to 11 ppm/Kg;
        forming a core dielectric material layer covering the first patterned conductive plate and filling into the apertures of the first patterned conductive plate; and
        forming core conductive layers over surfaces of the core dielectric material layer, wherein the core conductive layers are located at the first surface and the second surface of the first core layer, and a material of the core conductive layers is different than the material of the first patterned conductive plate;
    forming a first build-up layer over the first surface of the first core layer; and
    forming a second build-up layer over the second surface of the first core layer,
    wherein the first patterned conductive plate is electrically isolated by the core dielectric material layer from the first build-up layer and the second build-up layer.

16. The method of fabricating a circuit board structure according to claim 15, wherein forming the core dielectric material layer comprises:
    providing a first sub-dielectric material and a second sub-dielectric material on two opposite sides of the first patterned conductive plate, and laminating the first sub-dielectric material, the first patterned conductive plate and the second sub-dielectric material together so as to form the core dielectric material layer having the first patterned conductive plate embedded therein, wherein an interface exist in between the first sub-dielectric material and the second sub-dielectric material.

17. The method of fabricating a circuit board structure according to claim 15, wherein forming the first core layer further comprises:
    patterning a second conductive plate to form a second patterned conductive plate having a plurality of apertures, wherein the core dielectric material layer is formed to further cover the second patterned conductive plate and to fill into the apertures of the second patterned conductive plate.

18. The method of fabricating a circuit board structure according to claim 15, further comprising:
    forming a second core layer having a top surface and a bottom surface opposite to the first surface, wherein forming the second core layer comprises:
        patterning a conductive plate to form a second patterned conductive plate having a plurality of apertures; and
        forming a core dielectric material layer covering the second patterned conductive plate and filling into the apertures of the second patterned conductive plate;
    attaching the bottom surface of the second core layer to the second surface of the first core layer through an adhesive film, and
    wherein the first build-up layer is formed over the first surface of the first core layer and the second build-up layer is formed over the top surface of the second core layer.

19. The method of fabricating a circuit board structure according to claim 15, further comprising:
    forming a plurality of plated through holes penetrating through the apertures of the first patterned conductive plate, wherein the plated through holes are formed to be electrically connected to the first build-up layer and the second build-up layer.

20. The method of fabricating a circuit board structure according to claim 17, wherein forming the core dielectric material layer comprises:
    providing a first sub-dielectric material, a second sub-dielectric material and a third sub-dielectric material, wherein the third sub-dielectric material is placed in between the first patterned conductive plate and the second patterned conductive plate, the first sub-dielectric material is placed over the second patterned conductive plate on a side opposite to where the third sub-dielectric material is located, and the second sub-dielectric material is placed over the first patterned conductive plate on a side opposite to where the third sub-dielectric material is located;
    laminating the first sub-dielectric material, the second patterned conductive plate, the third sub-dielectric material, the first patterned conductive plate and the second sub-dielectric material together so as to form the core dielectric material layer having the first patterned conductive plate and the second patterned conductive plate embedded therein, wherein a first interface exist in between the first sub-dielectric material and the third sub-dielectric material, and a second interface exist in between the second sub-dielectric material and the third sub-dielectric material.

* * * * *